(12) United States Patent
Sohn et al.

(10) Patent No.: US 7,939,750 B2
(45) Date of Patent: May 10, 2011

(54) POLYMER SOLAR CELL AND METHOD OF MANUFACTURING THE SAME

(75) Inventors: Byung Hee Sohn, Yongin-si (KR); Sang Cheol Park, Seoul (KR); Seok Gwang Doo, Seoul (KR); Ji Young Kim, Seoul (KR); Seung Ook Roh, Seoul (KR); Chang Hee Lee, Seoul (KR)

(73) Assignees: Samsung Electronics Co., Ltd. (KR); Seoul National University Industry Foundation (KR)

( * ) Notice: Subject to any disclaimer, the term of this patent is extended or adjusted under 35 U.S.C. 154(b) by 145 days.

(21) Appl. No.: 11/781,011

(22) Filed: Jul. 20, 2007

(65) Prior Publication Data

US 2008/0163927 A1 Jul. 10, 2008

(30) Foreign Application Priority Data

Jan. 5, 2007 (KR) .................. 10-2007-0001367

(51) Int. Cl.
*H01L 31/00* (2006.01)
(52) U.S. Cl. ...................................................... 136/263
(58) Field of Classification Search .................. 136/263
See application file for complete search history.

(56) References Cited

U.S. PATENT DOCUMENTS

| | | | |
|---|---|---|---|
| 2005/0121068 A1* | 6/2005 | Sager et al. | 136/252 |
| 2005/0279399 A1* | 12/2005 | Gaudiana et al. | 136/243 |
| 2006/0188745 A1* | 8/2006 | Liao et al. | 428/690 |
| 2009/0044855 A1* | 2/2009 | Irwin et al. | 136/255 |

OTHER PUBLICATIONS

Remi De Bettignies, Jocelyne Leroy, Muriel Firon, Carole Sentein "Accelerated lifetime measurements of P3HT:PCBM solar cells"; Synthetic Metals 156 (2006) 510-513.*

"Effects of Postproduction Treatment on Plastic Solar Cells"; Franz Padinger, Roman S. Rittberger, and Niyazi S. Sariciftci; 203, 13 No. 1, January, pp. 85-88.

* cited by examiner

*Primary Examiner* — Jeffrey T Barton
*Assistant Examiner* — Allison Bourke
(74) *Attorney, Agent, or Firm* — Cantor Colburn LLP

(57) ABSTRACT

Disclosed herein are a polymer solar cell, comprising a substrate, a first electrode, a hole injection layer, a photoactive layer, and a second electrode, characterized in that an electron-accepting layer is formed between the photoactive layer and the second electrode, and a method of manufacturing the polymer solar cell. The polymer solar cell comprises an electron-accepting layer between the photoactive layer and the second electrode, thereby assuring excellent power conversion efficiency. Furthermore, high power conversion efficiency can also be attained in a low-temperature thermal annealing process.

15 Claims, 6 Drawing Sheets

POLYMER SOLAR CELL AND METHOD OF MANUFACTURING THE SAME

CROSS-REFERENCE TO RELATED PATENT APPLICATION

This non-provisional application claims priority under U.S.C. §119(a) to Korean Patent Application No. 2007-0001367, filed on Jan. 5, 2007, the entire contents of which are hereby incorporated by reference.

BACKGROUND OF THE INVENTION

1. Field of the Invention

The present invention relates to a polymer solar cell and a method of manufacturing the same, and more specifically, to a polymer solar cell comprising an electron-accepting layer between a photoactive layer and a second electrode, capable of realizing increased power conversion efficiency. In particular, high power conversion efficiency can be attained even in a low-temperature thermal annealing process.

2. Description of the Related Art

In general, a solar cell is a photovoltaic device used for the conversion of solar light into electrical energy. A solar cell is usable without limitation, is environmentally friendly, unlike other energy sources, and, is thus expected to become an increasingly important energy source over time.

Conventionally, a silicon solar cell made of monocrystalline or polycrystalline silicon has been mainly utilized. However, the silicon solar cell suffers from disadvantages because it has a high manufacturing cost and cannot be applied to a flexible substrate. As an alternative to the silicon solar cell, thorough research into polymer solar cells is currently ongoing.

The polymer solar cell may be manufactured through spin coating, ink-jet printing, roll coating, or doctor blading, and therefore the manufacturing process is simple resulting in a low manufacturing cost. Further, the use of a polymer solar cell is advantageous because a large area may be coated, a thin film may be formed even at low temperatures and, almost any kind of substrate, including a glass substrate and a plastic substrate, may be used.

In addition, solar cells having various shapes may be manufactured, such as curved or spherical plastic molded products, which may also be bent or folded so that they are easily portable. When making use of the above advantages, a solar cell may be manufactured that can easily be attached to people's clothes, bags, or be mounted to portable electrical or electronic products. In addition, when a polymer blend film, having high transparency to light, is attached to the glass windows of buildings or the glass windows of automobiles, it can generate power while simultaneously allowing a person to see through the window. Consequently, polymer solar cells have a broader range of application than opaque silicon solar cells.

Although the polymer solar cell possesses the above advantages, it is unsuitable for practical use because the power conversion efficiency thereof is low and the lifetime thereof is short. That is, by the end of the 1990s the power conversion efficiency of the polymer solar cell was only about 1%. However, since the year 2000, the performance of the cell has begun to greatly increase through improvements in the structural morphology of the polymer blend. Presently, in the case where the power conversion efficiency of the polymer solar cell is measured under solar light conditions of AM 1.5 global 100 mW/cm$^2$, a unit device having a small area (0.1 cm$^2$ or less) has power conversion efficiency of about 4 to about 5%, and a device having an area of 1 cm$^2$ has power conversion efficiency of about 3% ((M. A. Green, K. Emery, D. L. King, Y. Hishikawa and W. Warta, Prog. Photovolt. Res. Appl. 14, 455-461(2006)).

Typically, a polymer solar cell comprises a first electrode, a second electrode, and a thin film layer composed of a conjugated polymer or a conductive polymer having semiconductor properties and, an electron acceptor between the first electrode and the second electrode.

An example of a polymer useful in a polymer solar cell, is a conductive polymer such as polythiophene or p-phenylene vinylene ("PPV") derivatives, that function as an electron donor. When the conductive polymer absorbs light having a wavelength not less than an energy band gap, it is excited to an exciton. The exciton binding energy of the conductive polymer typically ranges from 0.1 to 1.0 eV, which is considerably greater than thermal energy (about 0.025 eV) at room temperature. Accordingly, since the conductive polymer has a low probability of being separated into free electrons and complementary positively charged holes, solar cells using a thin film composed exclusively of the conductive polymer have very low power conversion efficiencies of about 0.1% or less.

In order to increase the free electron production efficiency of a single film comprising the conductive polymer, the use of a double film composed of a conductive polymer and an electron acceptor has been proposed. However, the exciton diffusion length in the polymer semiconductor, is of about 3 to about 10 nanometers (nm). Thus, in the thin double layer comprised of the conductive polymer and an electron acceptor, free charges are produced only in the narrow region corresponding to the heterojunction interface, which is about 3 to about 10 nm thick, in the total thin film layer which is about 100 nm thick. Consequently, the charge production efficiency is still low.

With the goal of increasing the heterojunction interface between the conductive polymer and the electron acceptor, research is being conducted into polymer solar cells that include a blend layer of conductive polymer and an electron acceptor. As such, the heterojunction interface between the conductive polymer and the electron acceptor is distributed over the entire internal portion of the thin film, and thus the production of free charges may be effectively realized throughout the entire thin film layer. For example, power conversion efficiency of about 3.5% has been reported using a blend film of "P3HT" (poly(3-hexylthiophene)) and "PCBM" ([6,6]-phenyl-C$_{61}$ butyric acid methyl ester) and a thin LiF buffer layer at the junction interface with an Al electrode. [F. Padinger, R. S. Rittberger, N. S. Sariciftci, *Adv. Func. Mater.*, 13, 85(2003)] However, such a polymer solar cell still has lower power conversion efficiency than other thin-film solar cells, and extensive effort is required to further increase the power conversion efficiency of polymer solar cells.

In the polymer solar cell, various attempts have been made to increase the crystallinity of the polymer through thermal annealing at about 120 to about 160° C., in order to improve the low charge mobility of the polymer due to the disordered structure of the polymer nanocomposite.

In the case where the solar cell is manufactured on a plastic substrate, it is difficult to perform thermal annealing due to problems related to the thermal deformation of the plastic. Therefore, decreasing the thermal annealing temperature of the polymer blend is considered to be an important step in the development of plastic solar cells.

SUMMARY OF THE INVENTION

In one embodiment, the present invention provides a polymer solar cell, which comprises an electron-accepting layer between a photoactive layer and a second electrode, thereby assuring high power conversion efficiency even upon low-temperature thermal annealing.

In another embodiment, the present invention provides a method of manufacturing a polymer solar cell, which can prevent the deformation of a substrate upon thermal annealing, thus making it possible to manufacture a flexible solar cell with higher power conversion efficiency.

In accordance with one aspect of the present invention, there is provided a polymer solar cell, comprising a substrate, a first electrode positioned on the substrate comprising a conductive layer, a hole injection layer positioned on the first electrode, a photoactive layer positioned on the hole injection layer, an electron-accepting layer positioned on the photoactive layer, and a second electrode.

In accordance with another aspect of the present invention, the electron-accepting layer of the polymer solar cell may comprise a $C_{60}$-$C_{70}$ fullerene derivative, and preferably comprises PCBM ([6,6]-phenyl-$C_{61}$ butyric acid methyl ester).

In accordance with yet another aspect of the present invention, there is provided a method of manufacturing a polymer solar cell, comprising a substrate, a first electrode, a hole injection layer, a photoactive layer, and a second electrode, the method comprising forming an electron-accepting layer between the photoactive layer and the second electrode.

DESCRIPTION OF THE PREFERRED EMBODIMENTS

Hereinafter, a detailed description of the exemplary embodiments of the present invention will be provided, with reference to the accompanying drawings.

According to one embodiment of the present invention, the solar cell comprises a substrate, a first electrode, a hole injection layer, a photoactive layer, an electron-accepting layer, and a second electrode.

In another embodiment, the polymer solar cell includes the electron-accepting layer between the photoactive layer and the second electrode, thereby increasing the interfacial properties of the photoactive layer and the second electrode. Hence, high levels of power conversion efficiency can be attained even in a low-temperature thermal annealing process.

Figure 1:
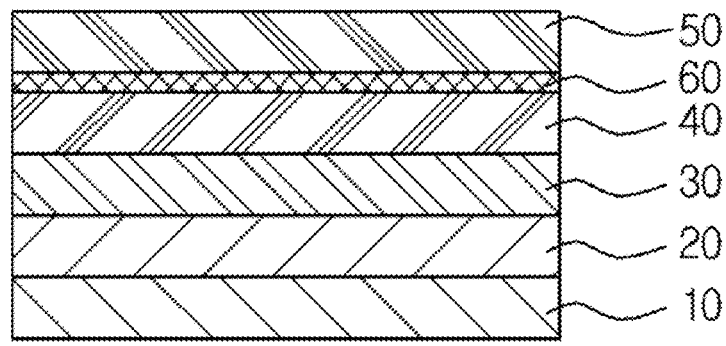
FIG. 1 schematically shows an exemplary embodiment of a cross-section of the polymer solar cell, according to the present invention.

FIG. 1 is an exemplary embodiment of the present invention illustrating a sectional view of the structure of the polymer solar cell.

As shown in FIG. 1, the polymer solar cell of the invention comprises a substrate 10, a first electrode 20 comprising a conductive layer positioned on the substrate 10, a hole injection layer 30 positioned on the first electrode 20, a photoactive layer 40 positioned on the hole injection layer 30, an electron-accepting layer 60 positioned on the photoactive layer 40, and a second electrode 50.

In yet another embodiment, the polymer solar cell of the present invention is characterized in that the electron-accepting layer 60 is intercalated between the photoactive layer 40 and the second electrode 50.

The electron-accepting layer 60 is preferably composed of material having a good ability to capture electrons. Examples of electron-accepting layers include $C_{60}$-$C_{70}$ fullerene derivatives, carbon nanotubes, carbon nanotube derivatives, and the like. Particularly useful is PCBM.

Without being limited by theory, the principle governing the high levels of power conversion efficiency attained by the polymer solar cell of the present invention, even at low annealing temperatures, is as follows.

In a typical polymer solar cell including only a photoactive layer (P3HT:PCBM blend layer), thermal annealing is performed at about 150° C. (420 Kelvin ("K")) to increase the charge mobility of the photoactive layer. Through such thermal annealing, PCBM molecules diffuse in the P3HT:PCBM blend layer, resulting in phase separation, in which the PCBM molecules are agglomerated and, the production of PCBM clusters and P3HT crystallites occur. When the PCBM clusters are produced, the electron mobility is increased. Furthermore, the hole mobility is also increased in the P3HT crystallite.

Figure 3A:
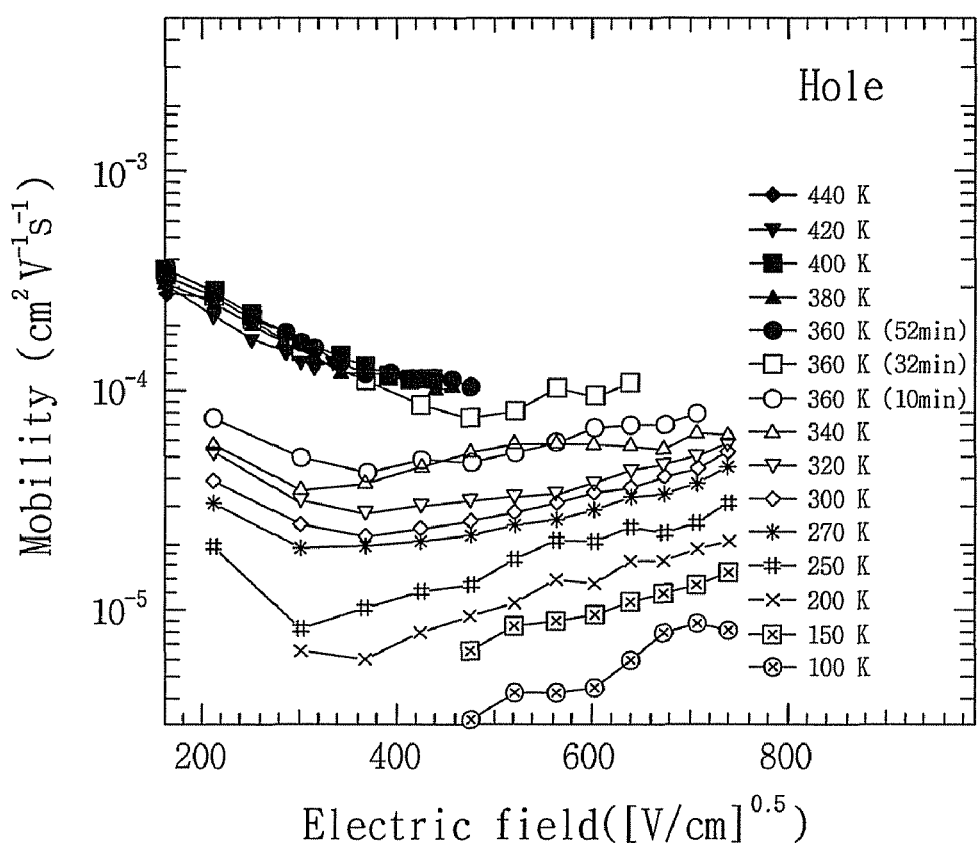
FIGS. 3A and 3B are graphs that show the hole mobility of the P3HT:PCBM blend layer, measured at various temperatures (about 100 to about 440 Kelvin (K)) and under various electric fields.
Figure 3B:
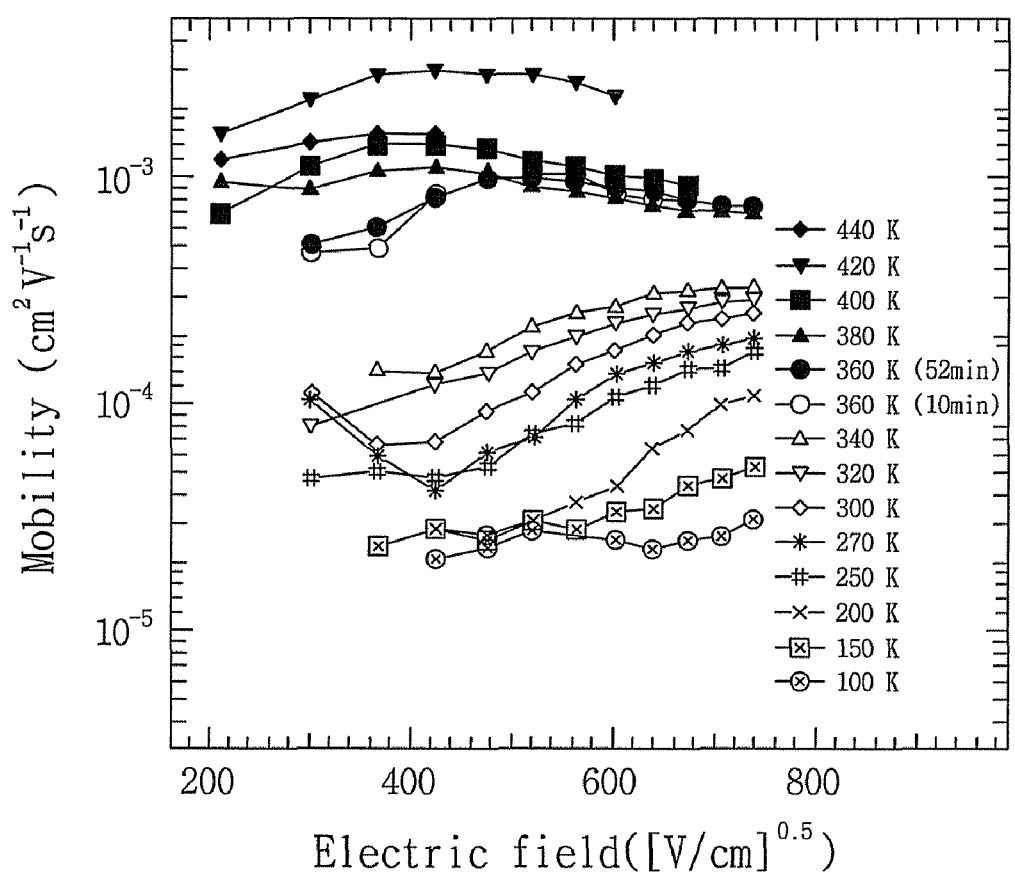

According to exemplary embodiments of the present invention, as shown in FIGS. 3A and 3B, an increase in the charge mobility of the P3HT:PCBM blend layer through thermal annealing can be observed in the temperature range of about 340 to about 360 K, whereas at higher temperatures, the charge mobility does not increase any further even though the temperature is increased. Conversely, in the typical polymer solar cell, when thermal annealing is performed at temperatures lower than 150° C. (420 K), the efficiency is remarkably decreased.

A sufficient increase in the charge mobility of the P3HT:PCBM blend layer is achieved through thermal annealing at about 340 to about 360 K for about 1 hour. Nevertheless, the increase in the power conversion efficiency requires thermal annealing at higher temperatures (about 150° C. (420 K)). This is because the thermal annealing at higher temperatures changes the interfacial properties of the P3HT:PCBM blend layer and the electrode. That is, when the thermal annealing temperature is increased, it is expected that the interface between the P3HT:PCBM blend layer and the electrode contains more PCBM molecules due to the diffusion of PCBM molecules having a low molecular weight to the surface. Consequently, the interfacial properties between the P3HT:PCBM blend layer and the electrode affect the power conversion efficiency.

Without being limited by theory, the polymer solar cell of the present invention includes a thin PCBM film between the P3HT:PCBM blend layer and the second electrode. Therefore, even though thermal annealing is performed at about 90° C., which is a considerably lower temperature than conventional thermal annealing, high power conversion efficiency can be attained.

In one embodiment, the PCBM film preferably has a thickness of about 0.1 to about 10 nm.

In another embodiment, the substrate of the polymer solar cell, is not particularly limited as long as it is transparent, and may be a transparent inorganic substrate, such as quartz and glass, or a transparent plastic substrate selected from the group consisting of polyethylene terephthalate ("PET"), polyethylene naphthalate ("PEN"), polycarbonate ("PC"), polystyrene ("PS"), polypropylene ("PP"), polyimide ("PI"), polyethersulfonate ("PES"), polyoxymethylene ("POM"), AS resin, ABS resin and a combination comprising at least one of the foregoing.

In yet another embodiment, the substrate 10 preferably has a wavelength transmittance of greater than or equal to 70%, and more preferably greater than or equal to 80% in the visible light range of about 400 to about 750 nm.

In one aspect of the present invention, the first electrode 20 acts as a path for light that passes through the substrate 10 and reaches the photoactive layer 40. Thus, the first electrode 20 preferably comprises a highly transparent material. More preferably, the first electrode 20 is comprised of a conductive material having a high work function of greater than or equal to 4.5 eV and, low resistance. Examples of conductive materials useful for the first electrode 20 include, but are not limited to, indium tin oxide ("ITO"), gold, silver, fluorine-doped tin oxide ("FTO"), $ZnO-Ga_2O_3$, $ZnO-Al_2O_3$, and $SnO_2-Sb_2O_3$.

The holes separated in the photoactive layer 40 reach the first electrode 20 through the hole injection layer 30. The first electrode 20 may be deposited on the substrate 10 through thermal evaporation, e-beam evaporation, RF or magnetron sputtering, chemical deposition, or methods similar thereto.

In another aspect of the present invention, the hole injection layer 30 is formed of a conductive polymer. Examples of suitable conductive polymers for the hole injection layer include, one or more selected from the group consisting of "PEDOT" (poly(3,4-ethylenedioxythiophene), "PSS" (poly (styrenesulfonate)), polyaniline, phthalocyanine, pentacene, polydiphenylacetylene, poly(t-butyl)diphenylacetylene, poly(trifluoromethyl)diphenylacetylene, Cu-PC (copper phthalocyanine), poly(bistrifluoromethyl)acetylene, polybis(t-butyl-diphenyl)acetylene, poly(trimethylsilyl)diphenylacetylene, poly(carbazole)diphenylacetylene, polydiacetylene, polyphenylacetylene, polypyridine acetylene, polymethoxyphenylacetylene, polymethylphenylacetylene, poly(t-butyl) phenylacetylene, polynitrophenylacetylene, poly(trifluoromethyl)phenylacetylene, poly(trimethylsilyl)phenylacetylene, and derivatives thereof, and a combination comprising at least one of the foregoing polymers. Preferably, a mixture of PEDOT-PSS is used.

The conductive polymer material used for the hole injection layer may be applied to a thickness of about 5 to about 2000 nm on the first electrode using a typical coating process, for example, spraying, spin coating, dipping, printing, doctor blading, or sputtering, or through electrophoresis.

In yet another aspect the present invention, the photoactive layer 40 comprises a blend layer of a conductive polymer and, an electron acceptor, including a p-type conductive polymer material having π-electrons as an electron donor, and fullerene or derivatives thereof, as an electron acceptor.

Examples of suitable conductive polymers used for the photoactive blend layer include, one or more selected from the group consisting of P3HT (poly(3-hexylthiophene), polysiloxane carbazole, polyaniline, polyethylene oxide, poly(1-methoxy-4-(O-disperse Red 1)-2,5-phenylene-vinylene, polyindole, polycarbazole, polypyridiazine, polyisothianaphthalene, polyphenylene sulfide, polyvinylpyridine, polythiophene, polyfluorene, polypyridine, and derivatives thereof, and a combination comprising at least one of the foregoing conductive polymers.

Examples of the electron acceptor used for the photoactive blend layer include, but are not limited to, fullerene or derivatives thereof, nanocrystals such as CdSe, carbon nanotubes, nanorods, nanowires, or the like, or a combination comprising at least one of the foregoing electron acceptors.

In one embodiment, the photoactive layer is preferably composed of a mixture of the electron donor, such as P3HT, and the electron acceptor, such as the fullerene derivative, for example, PCBM ([6,6]-phenyl-$C_{61}$ butyric acid methyl ester), which are mixed at a weight ratio of about 1:0.1 to about 1:2.

A photoactive layer of about 5 to about 2000 nm in thickness may also be applied on the hole injection layer using a typical coating process, for example, spraying, spin coating, dipping, printing, doctor blading, or sputtering, or through electrophoresis.

The electrons generated at the heterojunction interface of the photoactive layer 40 reach the second electrode 50 through the electron-accepting layer 60.

In another embodiment of the present invention, the second electrode 50 comprises material having a low work function. Suitable examples of such material are, metals, such as magnesium, calcium, sodium, potassium, titanium, indium, yttrium, lithium, aluminum, silver, tin, lead, or the like, or a combination comprising at least one of the foregoing metals. The second electrode may be deposited on the electron-accepting layer using the same process used for the first electrode.

The second electrode 50 may have a multilayer structure obtained by forming a LiF or $LiO_2$ buffer layer on the electron-accepting layer and then depositing the above electrode material on the buffer layer.

In yet another embodiment, the present invention provides a method of manufacturing a polymer solar cell comprising, forming a hole injection layer on a substrate comprising a conductive layer, forming a photoactive layer on the hole injection layer, performing thermal annealing, forming an electron-accepting layer on the photoactive layer, and forming a second electrode on the electron-accepting layer.

In one embodiment, the thermal annealing is preferably performed at about 80 to about 110° C.

According to the present invention, the method of manufacturing the solar cell is not particularly limited, and any method may be used without limitation as long as it is typically known in the art.

Herein, exemplary embodiments of the present invention will be described in more detail with reference to the following examples. However, these examples are merely set forth to illustrate the invention, and thus are not to be construed as limiting the scope of the present invention.

EXAMPLES

Example 1

Measurement of Charge Mobility of P3HT:PCBM Blend Layer (1) Fabrication of Measurement Device PEDOT:PSS [Baytron P Al 4083 poly(3,4-ethylenedioxythiophene)/poly(styrenesulfonate)] was applied on dry ITO glass through spin coating at 4000 rpm for 30 seconds (sec.). The coated device was dried in a vacuum oven at 120° C. for 30 minutes (min) or longer. A P3HT:PCBM blend solution was applied onto the substrate coated with the PEDOT:PSS film via spin coating at 1000 rpm for 30 sec.

The P3HT:PCBM blend solution was prepared as follows. P3HT and PCBM were separately dissolved to 4 weight percent (wt %) in a chlorobenzene solvent and then dispersed on a hot plate at 50° C. or higher for 30 min or longer using stirring magnets. The P3HT solution and the PCBM solution were filtered using a 0.3 micrometer (μm) PVDF filter, and a 0.5 μm PVDF filter, respectively. By adjusting the ratio of the individual P3HT and PCBM solutions, P3HT:PCBM blend solutions having various concentrations were prepared.

Figure 2:
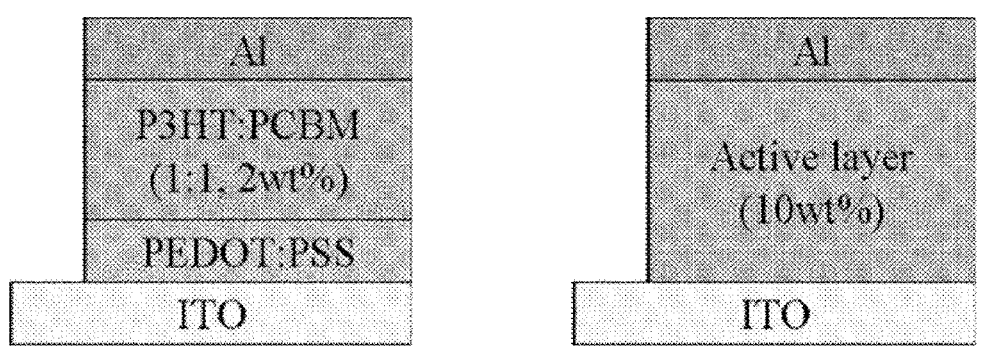
FIG. 2 is an exemplary embodiment that schematically shows a cross-section of the sample device for measuring the charge mobility of a P3HT:PCBM blend layer.

The P3HT:PCBM blend film was formed and then dried at room temperature for 1 hour or longer in a nitrogen atmosphere to remove the solvent. Following the drying process, LiF and Al were deposited on the P3HT:PCBM blend film through vacuum thermal evaporation, thus manufacturing a solar cell. The structure of the solar cell is shown in FIG. 2. The device for measuring the "TOF-PC" (time-of-flight photocurrent) of the film, was coated so that the thickness of the film was about 1 μm or more. For this, the concentration of the P3HT:PCBM blend was increased to 10 wt %, and the blend was applied via spin coating at a rate of 800 rpm. The thickness of the P3HT:PCBM blend film was measured to be 1.1 μm using an Alpha-step 500.

(2) Measurement of Charge Mobility

The polymer blend solar cell was mounted to a cryostat in order to facilitate measurements in the temperature range from about 100 K to about 440 K. Using a KEITHLEY 236 DC source meter, current-voltage ("I-V") was measured both in the dark (dark I-V) and upon light irradiation, and the photocurrent spectrum was determined. The light source used for the experiment was a Muller Xenon lamp 300 W (Watts). When the photocurrent was measured, the intensity of light was controlled to be AM 1.5 (about 100 mW/cm$^2$), which equals general solar light intensity using a Neutral density filter.

Using the TOF-PC method, the charge mobility of the P3HT:PCBM blend was measured. Voltage was applied to the device for measuring TOF-PC using an E3614A power meter, available from Agilent. Further, using a GL-3300 nitrogen laser available from "PTI" (Photon Technology International), laser pulses at 337 nm were applied through the ITO electrode in order to generate a photocurrent. The photocurrent was then measured using a digital oscillator (Tektronix TDS 5054B). The charge transfer time $\tau_{tr}$ was determined based upon the photocurrent measurement, and the charge mobility was then calculated using the following equation:

$$\mu = d^2/(V\tau_{tr})$$ [Equation 1]

In Equation 1, d is the thickness of the device, V is the applied voltage, and $\tau_{tr}$ is the charge transfer time.

(3) Analysis of Results

FIGS. 3A and 3B show the charge mobility of the P3HT:PCBM blend layer, measured at various temperatures and under various electric fields. The electron mobility (FIG. 3B) was greater than the hole mobility (FIG. 3A) throughout the entire temperature range. At room temperature, the hole mobility was measured to be $5.73 \times 10^{-5}$ cm$^2$/Vs, and the electron mobility was measured to be $1.64 \times 10^{-4}$ cm$^2$/Vs. When comparing the above results P3HT:PCBM/PCBM) with those of the P3HT:PCBM film, the hole mobility of the P3HT:PCBM blend layer was slightly decreased whereas the electron mobility was slightly increased. The reason for this difference is thought to be because the addition of the PCBM, which has high electron mobility, leads to the increased electron mobility of the P3HT:PCBM film, and causes the structure of the P3HT to be highly disordered, thus decreasing the hole mobility. When investigating the effect of temperature on charge mobility, it was observed that both the hole mobility and the electron mobility have a tendency to increase depending on the temperature. In particular, when the temperature was increased from 340 K to 360 K, the hole mobility and the electron mobility were greatly increased. Further, the hole mobility was observed to continuously increase at 360 K for about 1 hour at which point it reached an equilibrium state. The hole mobility at 360 K increased from $4.27 \times 10^{-5}$ cm$^2$/Vs at 10 minutes, to $1.13 \times 10^{-4}$ cm$^2$/Vs at 32 minutes, and then to $1.19 \times 10^{-4}$ cm$^2$/Vs at 52 minutes. At temperatures of 360 K or higher, almost no increase in electron mobility or hole mobility was observed.

Example (2)

Fabrication of a Polymer Solar Cell

Comparative Example 1

A glass substrate coated with ITO was dipped in distilled water, in which a detergent was dissolved, and was then subjected to ultrasonic cleaning for 30 min. Subsequently, the glass substrate was dipped in distilled water, subjected to ultrasonic cleaning for 5 min, and then the washing was repeated twice more.

After the completion of the distilled water washing, the glass substrate was subjected to ultrasonic cleaning in the solvents isopropyl alcohol, acetone, and methanol, in that order, and was then dried. The glass substrate coated with ITO was subjected to plasma treatment for 5 min under the conditions of 14 mtorr pressure and 50 W power, using nitrogen plasma in a plasma cleaner.

On the ITO transparent electrode, 1 ml of a PEDOT:PSS solution (Baytron P AL 4083, available from Bayer), mixed 1:1 in chlorobenzene, was spin coated at 4,000 rpm for 30 sec. This process formed a hole injection layer 200 nm thick, which was then dried in a vacuum oven at 120° C. for 30 min.

Subsequently, P3HT and PCBM were dissolved in chlorobenzene at a weight ratio of 1:0.8, and then spin coated at 1,000 rpm for 30 sec on top of the hole injection layer, thus forming a photoactive layer 1100 nm thick, which was then dried for 30 min in a nitrogen atmosphere. As such, the ratio of the P3HT and PCBM relative to the solvent was 2 wt %.

Thereafter, thermal annealing was performed at 90° C. for 30 min, a PCBM film was deposited to a thickness of 5 nm using a vacuum deposition machine, and then LiF/Al was deposited as a second electrode, thereby manufacturing a solar cell.

Comparative Example 2

A solar cell was manufactured in the same manner as in Example 1, with the exception that the thermal annealing was not performed after the photoactive layer was formed, but was performed after the PCBM film and the LiF/Al electrode were deposited.

Comparative Example 3

A solar cell was manufactured in the same manner as in Example 1, with the exception that the thermal annealing was performed at 150° C.

Comparative Examples 4-6

Solar cells were manufactured in the same manner as in Comparative Examples 1-3, with the exception that the PCBM film was not formed between the blend layer of conductive polymer and electron acceptor and, the second electrode.

Figure 4:
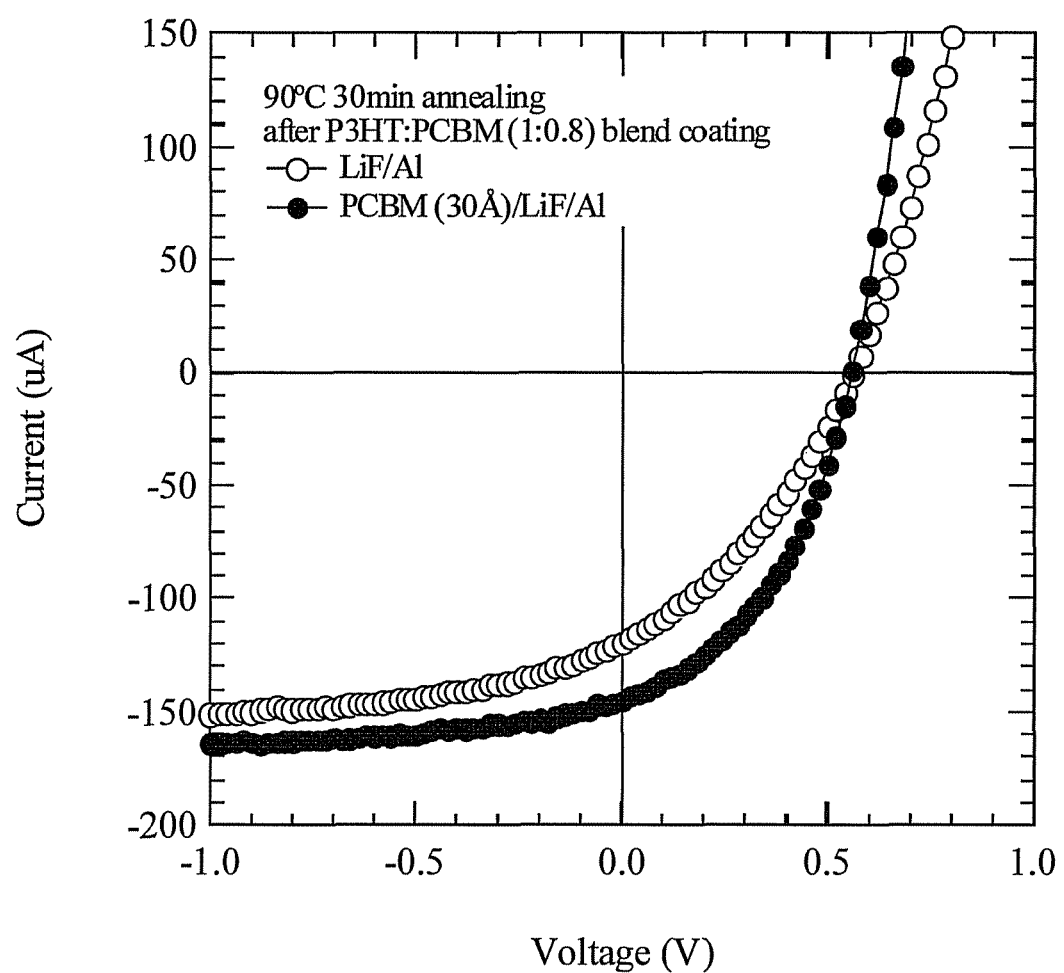
FIG. 4 is a graph comparing the photocurrent-photovoltage of a conventional solar cell having no PCBM film, manufactured through application of the P3HT:PCBM blend layer and then thermal annealing at 90° C., and the solar cell further including a PCBM film.
Figure 5:
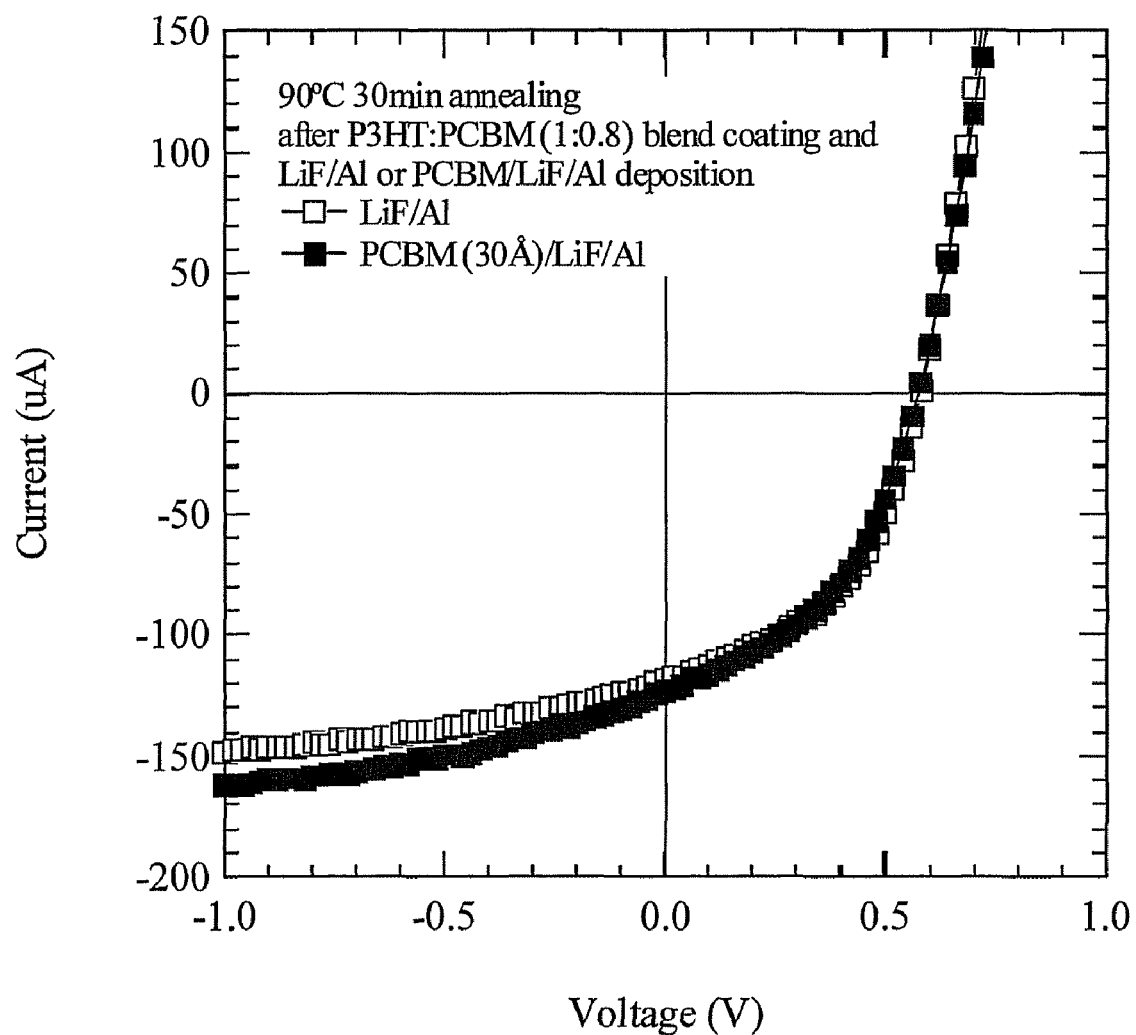
FIG. 5 is a graph comparing the photocurrent-photovoltage of a conventional solar cell manufactured through application of the P3HT:PCBM blend layer, deposition of the LiF/Al electrode, and then thermal annealing at 90° C., and a solar cell manufactured through deposition of the PCBM film and the LiF/Al electrode and then thermal annealing at 90° C.
Figure 6:
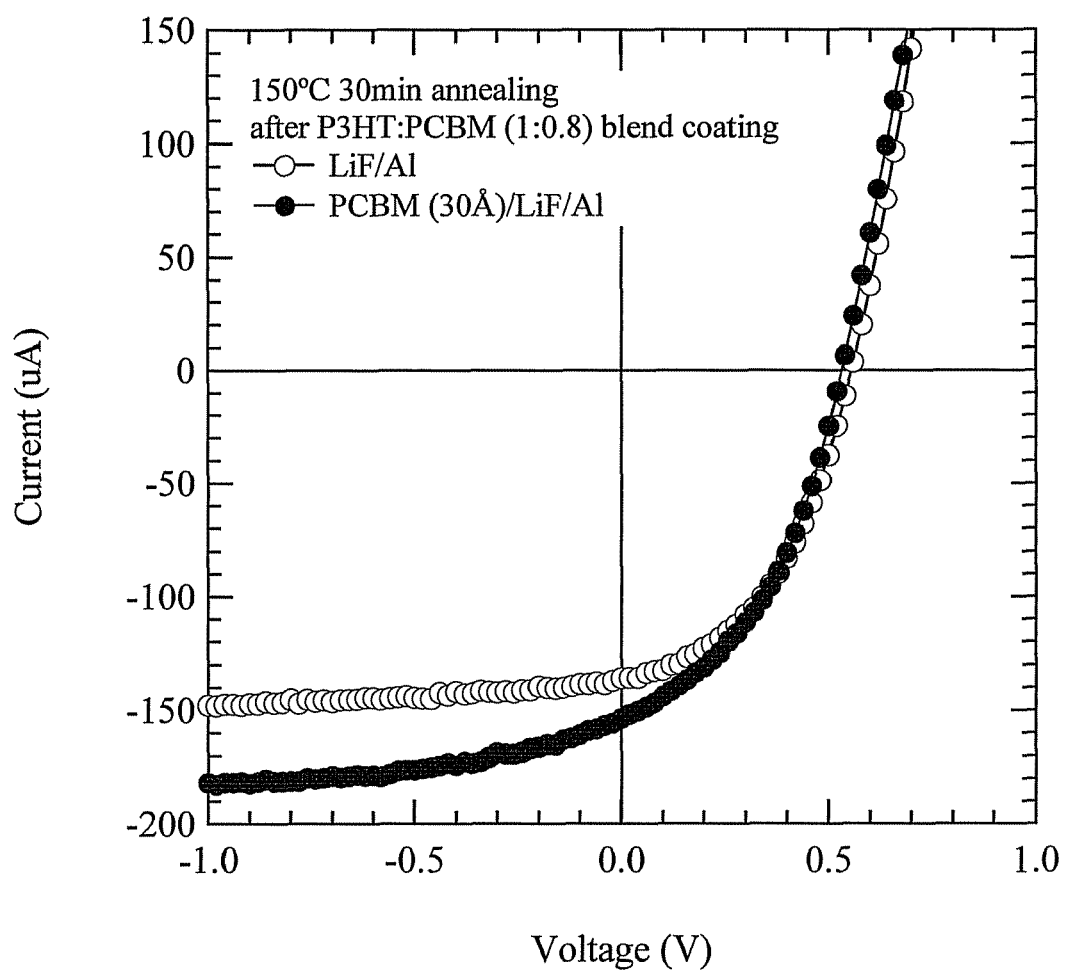
FIG. 6 is a graph comparing the photocurrent-photovoltage of a conventional solar cell having no PCBM film, manufactured through application of the P3HT:PCBM blend layer and then thermal annealing at 150° C., and the solar cell further including a PCBM film.

The photovoltage and the photocurrent of the solar cells manufactured in the comparative examples were measured. The results are shown in FIGS. 4, 5 and 6. As such, as a light source, a Xenon lamp (01193, available from Oriel) was used, and the solar conditions (AM 1.5) of the Xenon lamp were adjusted using a standard solar cell (Furnhofer Institute Solare Energiesysteme, Certificate No. C-ISE369, Type of material: Mono-Si+KG filter). Short-circuit current ($I_{sc}$), open-circuit voltage ($V_{oc}$) and a fill factor (FF), calculated from the above measured photocurrent-photovoltage curve, were substituted into the following equation, in order to calculate photovoltaic efficiency ($\eta_e$). The results are shown in Table 1 below.

$$\eta_e = (V_{oc} \cdot I_{sc} \cdot FF)/(P_{inc}) \quad \text{[Equation 2]}$$

In Equation 2, $P_{inc}$ is 100 mw/cm² (1 sun).

TABLE 1

| After Coating of P3HT:PCBM (1:0.8), Temp. and Sequence of Thermal Annealing, and Whether Deposition of PCBM or Not | $V_{OC}$ (V) | $I_{SC}$ (µA) | $J_{SC}$ (mA/cm²) | FF | Power Conversion Efficiency (%) (AM 1.5G 100 mW/cm²) |
|---|---|---|---|---|---|
| C. Ex. 1: After Annealing at 90° C. for 30 min, PCBM(30 Å)/LiF/Al Deposition | 0.561 | 145 | 7.41 | 0.42 | 1.73 |
| C. Ex. 2: After PCBM(30 Å)/LiF/Al Deposition, Annealing at 90° C. for 30 min, | 0.559 | 123 | 6.29 | 0.45 | 1.60 |
| C. Ex. 3: After Annealing at 150° C. for 30 min, PCBM(30 Å)/LiF/Al Deposition | 0.532 | 154 | 7.84 | 0.42 | 1.76 |
| C. Ex. 4: After Annealing at 90° C. for 30 min, LiF/Al Deposition | 0.578 | 119 | 6.08 | 0.33 | 1.18 |
| C. Ex. 5: After LiF/Al Deposition, Annealing at 90° C. for 30 min | 0.574 | 118 | 6.03 | 0.47 | 1.63 |
| C. Ex. 6: After Annealing at 150° C. for 30 min, LiF/Al Deposition | 0.555 | 136 | 6.94 | 0.45 | 1.74 |

As is apparent from Table 1, the properties of the device in which the P3HT:PCBM blend layer was applied and a PCBM layer 5 nm thick was deposited at the interface between the polymer-electron acceptor and the LiF/Al electrode, were superior to those of conventional solar cells without the PCBM layer. In particular, the conventional solar cell (Comparative Example 4) without a PCBM film, manufactured by applying the P3HT:PCBM blend layer and then performing thermal annealing at 90° C., had a power conversion efficiency of about 1.18%, whereas the device of Comparative Example 1 which included the PCBM film, had a power conversion efficiency of 1.73%. Based on this, the power conversion efficiency was increased by about 50% (FIG. 4). Furthermore, the power conversion efficiency of the device of Comparative Example 1 was similar to the power conversion efficiency of 1.74% for the conventional device (Comparative Example 6) subjected to thermal annealing at 150° C. (FIG. 6). Accordingly, excellent power conversion efficiency can be obtained at annealing temperatures much lower than those used for conventional solar cells. Thus a polymer solar cell using a plastic substrate having thermal deformability can be advantageously manufactured.

As described herein, the present invention provides a polymer solar cell and a method of manufacturing the same. According to the present invention, the polymer solar cell has an electron accepting layer, and a PCBM film layer formed between a blend layer of conductive polymer and electron acceptor and, a second electrode, thereby improving the interfacial properties of the second electrode and the electron acceptor. Thus, compared to conventional polymer solar cells, the power conversion efficiency of the solar cell of the invention can be increased by about 50% or more, and in particular, high power conversion efficiency can be attained even in a low-temperature thermal annealing process.

Although the preferred embodiments of the present invention have been disclosed for illustrative purposes, those skilled in the art will appreciate that various modifications, additions and substitutions are possible, without departing from the scope and spirit of the invention as disclosed and claimed in the accompanying claims.

What is claimed is:

1. A polymer solar cell, comprising:
   a substrate; and
   a first electrode comprising a conductive layer positioned on the substrate;
   a hole injection layer positioned on the first electrode;
   a photoactive layer positioned on the hole injection layer;
   an electron-accepting layer positioned on the photoactive layer;
   a buffer layer positioned on the electron-accepting layer; and a second electrode,
   wherein the photoactive layer is a blend layer comprising a conductive polymer and an electron acceptor, and wherein an electron-accepting layer comprises a C60-C70 fullerene derivative; and wherein the buffer layer comprises LiF.

2. The polymer solar cell of claim 1, wherein the electron-accepting layer further comprises PCBM ([6,6]-phenyl-$C_{61}$ butyric acid methyl ester).

3. The polymer solar cell of claim 1, wherein the electron-accepting layer has a thickness of about 0.1 to about 10 nm.

4. The polymer solar cell of claim 1, wherein the hole injection layer comprises material selected from the group consisting of PEDOT-PSS (poly(3,4-ethylenedioxythiophene))-(poly(styrenesulfonate)), polyaniline-CSA, pentacene, Cu-PC (copper phthalocyanine), P3HT (poly(3-hexylthiophene), polysiloxane carbazole, polyaniline, polyethylene oxide, (poly(1-methoxy-4-(O-disperse Red 1)-2,5-phenylene-vinylene), polyindole, polycarbazole, polypyridiazine, polyisothianaphthalene, polyphenylene sulfide, polyvinylpyridine, polythiophene, polyfluorene, polypyridine, and derivatives thereof, and; a combination comprising at least one of the foregoing.

5. The polymer solar cell of claim 4, wherein the hole injection layer has a thickness of about 5 to about 2000 nm.

6. The polymer solar cell of claim 1, wherein the conductive polymer is one or more selected from a group consisting of P3HT (poly(3-hexylthiophene), polysiloxane carbazole, polyaniline, polyethylene oxide, (poly(1-methoxy-4-(O-disperse Red 1)-2,5-phenylene-vinylene), polyindole, polycarbazole, polypyridiazine, polyisothianaphthalene, polyphenylene sulfide, polyvinylpyridine, polythiophene, polyfluorene, polypyridine, and derivatives thereof, and; a combination comprising at least one of the foregoing conductive polymers.

7. The polymer solar cell of claim 1, wherein the electron acceptor is selected from a group consisting of fullerene or derivatives thereof, nanocrystals, carbon nanotubes, carbon nanorods, carbon nanowires and; a combination comprising at least one of the foregoing electron acceptors.

8. The polymer solar cell of claim 6, wherein the conductive polymer is P3HT.

9. The polymer solar cell of claim 7, wherein the electron acceptor is PCBM.

10. The polymer solar cell of claim 1, wherein the conductive polymer and the electron acceptor are mixed at a weight ratio of about 1:0.8 to about 1:1.2.

11. The polymer solar cell of claim 10, wherein the conductive polymer and the electron acceptor are mixed at a weight ratio of about 1:0.8.

12. The polymer solar cell of claim 1, wherein the second electrode comprises metals selected from the group consisting of, including magnesium, calcium, sodium, potassium, titanium, indium, yttrium, lithium, aluminum, silver, tin, lead, and; a combination comprising at least one of the foregoing metals.

13. The polymer solar cell of claim 1, wherein the second electrode is aluminum.

14. A method of manufacturing a polymer solar cell, comprising:
    forming a hole injection layer on a substrate comprising a conductive layer;
    forming a photoactive layer on the hole injection layer, wherein the photoactive layer is a blend layer comprising a conductive polymer and an electron acceptor;
    performing thermal annealing;
    forming an electron-accepting layer on the photoactive layer;
    forming a buffer layer on the electron accepting layer; wherein the buffer layer comprises LiF; and
    forming a second electrode on the buffer layer.

15. The method of claim 14, wherein the thermal annealing is performed at about 80 to about 110° C.

* * * * *